United States Patent
Cho et al.

(10) Patent No.: US 9,837,632 B2
(45) Date of Patent: Dec. 5, 2017

(54) ORGANIC LIGHT EMITTING DISPLAY APPARATUS HAVING AN ANTI-IMPACT MEMBER

(71) Applicant: Samsung Display Co., Ltd., Yongin, Gyeonggi-do (KR)

(72) Inventors: Sung-Ho Cho, Yongin (KR); Yong-Je Jeon, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/151,741

(22) Filed: Jan. 9, 2014

(65) Prior Publication Data

US 2015/0014647 A1 Jan. 15, 2015

(30) Foreign Application Priority Data

Jul. 12, 2013 (KR) ........................ 10-2013-0082449

(51) Int. Cl.
*H01L 51/52* (2006.01)
(52) U.S. Cl.
CPC ........ *H01L 51/5237* (2013.01); *H01L 51/525* (2013.01)
(58) Field of Classification Search
CPC ............ H01L 27/3246; H01L 27/3295; H01L 27/3297; H01L 51/5228; H01L 51/5281; H01L 51/3246; H01L 51/5231
USPC ...................... 257/40, 72; 313/483, 498, 504
See application file for complete search history.

(56) References Cited

U.S. PATENT DOCUMENTS

| 7,528,543 B2 * | 5/2009 | Wang ................. H01L 27/3246 313/483 |
| 2004/0150319 A1 * | 8/2004 | Tomimatsu ......... H01L 27/3246 313/495 |
| 2005/0046349 A1 * | 3/2005 | Tanaka ................ H01L 51/5237 313/512 |
| 2007/0170605 A1 * | 7/2007 | Lee et al. ........................ 264/1.1 |
| 2009/0189517 A1 * | 7/2009 | Choi et al. ..................... 313/504 |
| 2009/0261719 A1 * | 10/2009 | Nimura ............... H01L 51/5237 313/504 |

(Continued)

FOREIGN PATENT DOCUMENTS

KR 10-2010-0081771 7/2010

OTHER PUBLICATIONS

EPO Search Report dated Feb. 4, 2015, for corresponding European Patent application 14162905.5, (7 pages).

*Primary Examiner* — Kyoung Lee
*Assistant Examiner* — Christina Sylvia
(74) *Attorney, Agent, or Firm* — Lewis Roca Rothgerber Christie LLP

(57) ABSTRACT

An organic light emitting display apparatus having improved impact resistance includes a bottom substrate including a display area and a peripheral area surrounding the display area; a plurality of organic light emitting devices arranged in the display area of the bottom substrate; a top substrate corresponding to the bottom substrate; a sealing member, which is arranged in the peripheral area of the bottom substrate and attaches the bottom substrate to the top substrate; and an anti-impact member, which is arranged in the peripheral area of the bottom substrate, is apart from the sealing member, and protrudes from the bottom substrate toward the top substrate.

15 Claims, 10 Drawing Sheets

(56) References Cited

U.S. PATENT DOCUMENTS

| | | | |
|---|---|---|---|
| 2010/0044692 A1* | 2/2010 | Kim | H01L 51/5281 257/40 |
| 2010/0171419 A1* | 7/2010 | Kim et al. | 313/505 |
| 2011/0221334 A1* | 9/2011 | Kwon | H01L 27/3246 313/504 |
| 2012/0012848 A1 | 1/2012 | Suh | |
| 2012/0025229 A1 | 2/2012 | Lee et al. | |
| 2012/0049728 A1* | 3/2012 | Lee | H01L 51/5246 313/512 |

\* cited by examiner

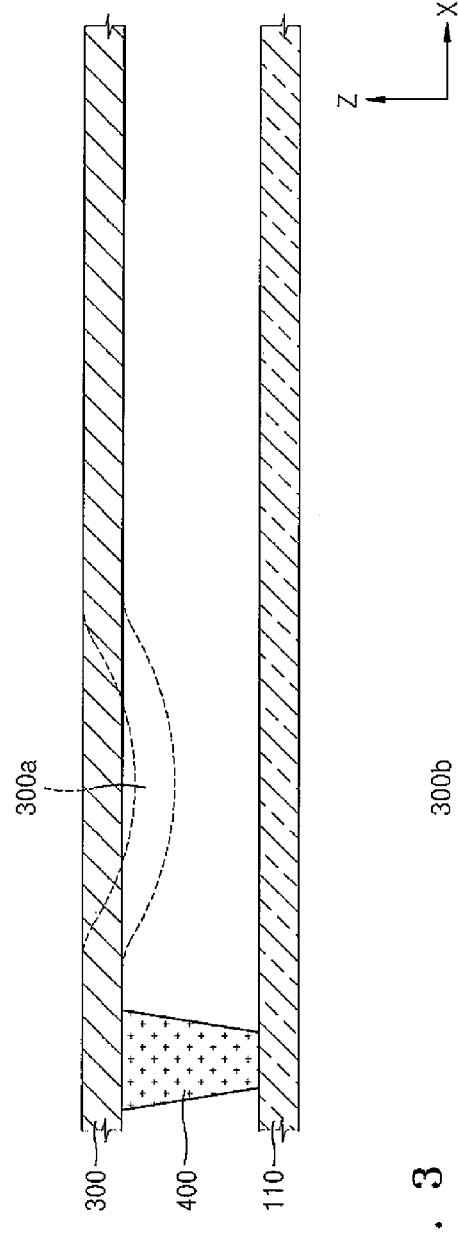
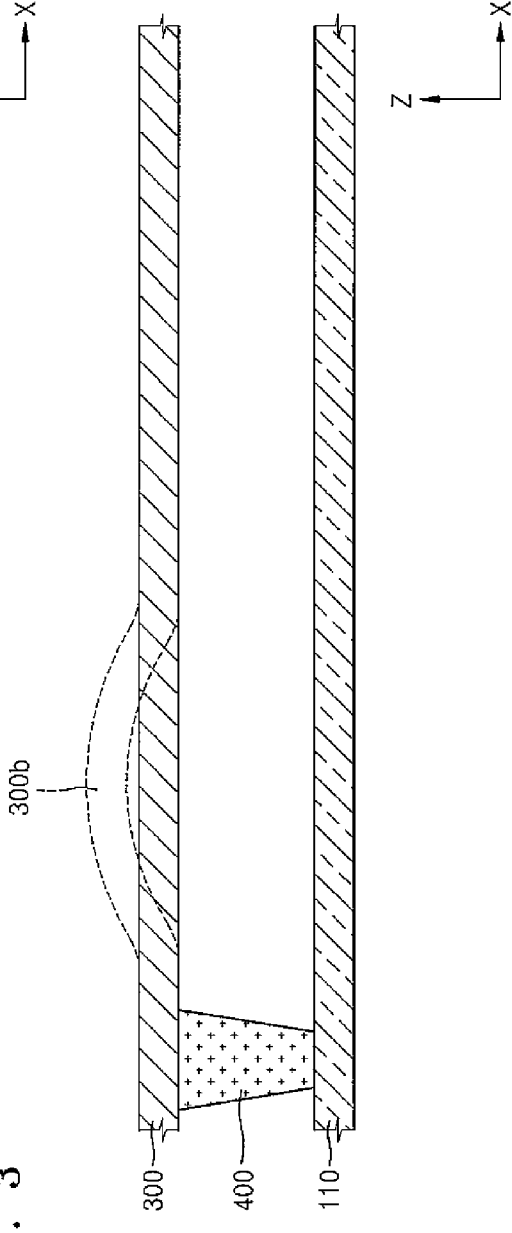

ORGANIC LIGHT EMITTING DISPLAY APPARATUS HAVING AN ANTI-IMPACT MEMBER

CROSS-REFERENCE TO RELATED APPLICATION

This application claims priority to and the benefit of Korean Patent Application No. 10-2013-0082449, filed on Jul. 12, 2013, in the Korean Intellectual Property Office, the content of which is incorporated herein in its entirety by reference.

BACKGROUND

1. Field

Aspects of the present invention are directed toward an organic light emitting display apparatus, and more particularly, to an organic light emitting display apparatus having improved impact resistance.

2. Description of the Related Art

Generally, an organic light emitting display apparatus is fabricated by forming organic light emitting devices on a bottom substrate and attaching a top substrate to the bottom substrate, such that the organic light emitting devices are arranged therebetween. Such an organic light emitting display apparatus is used as a display unit of a small product (such as a mobile phone) or a display unit of a large product (such as a television).

In such an organic light emitting display apparatus, a bottom substrate is attached to a top substrate via a sealing member.

However, such an organic light emitting display apparatus in the related art is easily damaged by external impacts.

SUMMARY

Aspects of the present invention are directed toward an organic light emitting display apparatus having improved impact resistance.

According to an embodiment of the present invention, an organic light emitting display apparatus includes a bottom substrate having a display area and a peripheral area surrounding the display area; a plurality of organic light emitting devices in the display area of the bottom substrate; a top substrate corresponding to the bottom substrate; a sealing member in the peripheral area of the bottom substrate and configured to attach the bottom substrate to the top substrate; and an anti-impact member in the peripheral area of the bottom substrate and apart from the sealing member, the anti-impact member protruding from the bottom substrate toward the top substrate.

In one embodiment, the plurality of organic light emitting devices include a plurality of pixel electrodes, a counter electrode corresponding to the plurality of pixel electrodes, and an intermediate layer between the plurality of pixel electrodes and the counter electrode and includes an emission layer, and a space corresponding to a thickness of the counter electrode is formed between the top substrate and an end surface of the anti-impact member toward the top substrate.

In one embodiment, the plurality of organic light emitting devices include a plurality of pixel electrodes, a counter electrode corresponding to the plurality of pixel electrodes, and an intermediate layer between the plurality of pixel electrodes and the counter electrode and includes an emission layer, the organic light emitting display apparatus further includes a pixel defining layer in the display area of the bottom substrate and configured to cover edge portions of the plurality of pixel electrodes to expose the center portions of the plurality of pixel electrodes, and a distance between the bottom substrate and an end surface of the anti-impact member toward the top substrate is identical to a distance between the bottom substrate and an end surface of the pixel defining layer toward the top substrate. The anti-impact member includes the same material as the pixel defining layer.

In one embodiment, the top substrate includes a trench at a position corresponding to the anti-impact member on a surface facing the bottom substrate, and a portion of the anti-impact member toward the top substrate is located inside the trench. The anti-impact member includes a first anti-impact unit and a second anti-impact unit, and the second anti-impact unit is located on the first anti-impact unit, and at least a portion of the second anti-impact unit is located inside the trench of the top substrate. The plurality of organic light emitting devices include a plurality of pixel electrodes, a counter electrode corresponding to the pixel electrodes, and an intermediate layer between the plurality of pixel electrodes and the counter electrode and includes an emission layer, the organic light emitting display apparatus further includes a pixel defining layer in the display area of the bottom substrate and configured to cover edge portions of the plurality of pixel electrodes to expose the center portions of the plurality of pixel electrodes, and a distance between the bottom substrate and an end surface of the first anti-impact member toward the top substrate is identical to a distance between the bottom substrate and an end surface of the pixel defining layer toward the top substrate. The first anti-impact unit includes the same material as the pixel defining layer.

In one embodiment, the plurality of organic light emitting devices include a plurality of pixel electrodes, a counter electrode corresponding to the pixel electrodes, and an intermediate layer between the plurality of pixel electrodes and the counter electrode and includes an emission layer, the organic light emitting display apparatus further includes a plurality of thin-film transistors in the display area of the bottom substrate and are electrically connected to the plurality of pixel electrodes, and an electrode power supply line on the same layer as one of the electrodes of the plurality of thin-film transistors, and a connecting unit between the anti-impact member and the bottom substrate, the connecting unit having a first end on the same layer as the plurality of pixel electrodes and contacting the counter electrode, and a second end contacting the electrode power supply line.

In one embodiment, the electrode power supply line is on the same layer as the source/drain electrodes of the plurality of thin-film transistors. The anti-impact member contacts the electrode power supply line or the connecting unit. The anti-impact member contacts at least one of the electrode power supply line, the connecting unit, and a layer below the electrode power supply line.

In one embodiment, the anti-impact member surrounds the display area of the bottom substrate. The anti-impact member is discretely located around the display area of the bottom substrate.

In one embodiment, the anti-impact member includes a first portion having a first width and a second portion having a second width smaller than the first width, and the first portion is closer to the bottom substrate than the second portion is. The second width is from about 20 μm to about 100 μm.

In one embodiment, the anti-impact member has an "凵"-like cross-sectional shape on a plane perpendicular to the bottom substrate.

In one embodiment, the anti-impact member includes a first end surface, a second end surface, and a third end surface, the first, second, and third end surfaces facing toward the top substrate and being apart from one another, and a first distance between the bottom substrate to the first end surface is longer than each of a second distance between the bottom substrate and the second end surface and a third distance between the bottom substrate and the third end surface. The second end surface is closer to the display area of the bottom substrate than the first end surface is, and the third end surface is closer to the sealing member than the first end surface is.

In one embodiment, a distance between an end portion toward the display area of a portion of the sealing member contacting the top substrate and the center of the anti-impact member is within 150 µm.

BRIEF DESCRIPTION OF THE DRAWINGS

The above and other features and enhancements of the present invention will become more apparent by describing in more detail example embodiments thereof with reference to the attached drawings in which:

FIGS. 2 and 3 are schematic diagrams showing that a top substrate is moved by external impact when an anti-impact member does not exist;

DETAILED DESCRIPTION

Figure 1:
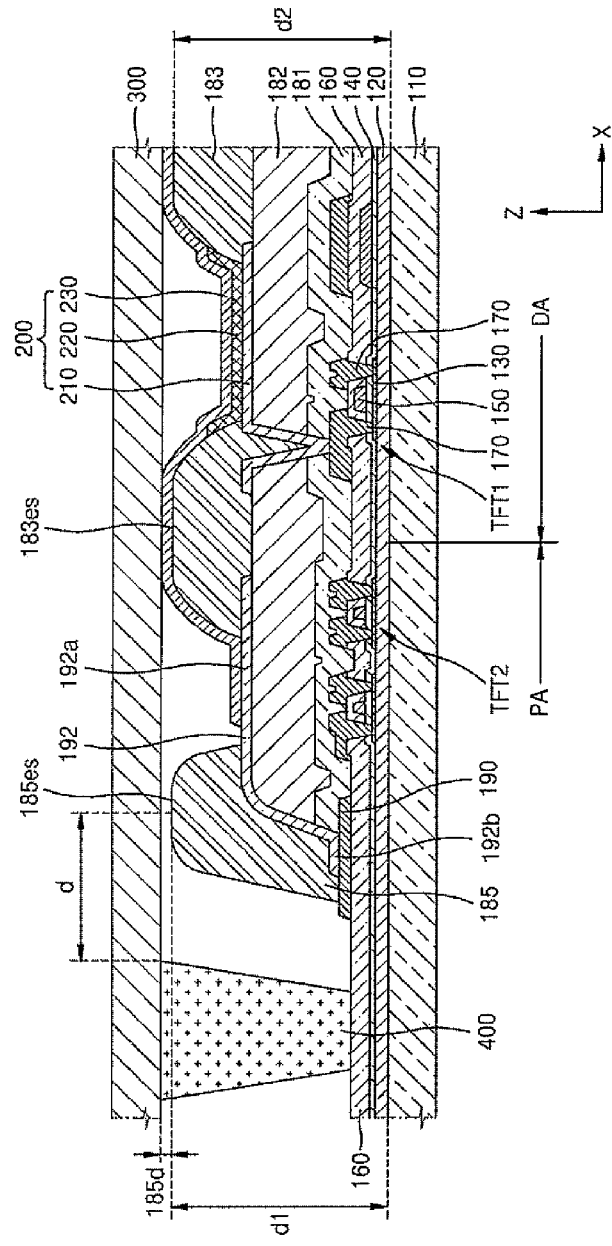
FIG. 1 is a schematic sectional view of an organic light emitting display apparatus according to an embodiment of the present invention.

As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the present invention refers to "one or more embodiments of the present invention."

The present invention will now be described more fully with reference to the accompanying drawings, in which example embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity.

In the embodiments below, the x-axis, the y-axis, and the z-axis are not limited to the three axes in the orthogonal coordinates system and may have broader meaning. For example, the x-axis, the y-axis, and the z-axis may be orthogonal to one another or may indicate three directions that are not orthogonal to one another.

It will also be understood that when a layer is referred to as being "on" another layer or substrate, it can be directly on the other layer or substrate, or intervening layers may also be present.

FIG. 1 is a schematic sectional view of an organic light emitting display apparatus according to an embodiment of the present invention. As shown in FIG. 1, the organic light emitting display apparatus according to the present embodiment includes a bottom substrate 110, a plurality of organic light emitting devices 200 located on the bottom substrate 110, a top substrate 300, a sealing member 400, and an anti-impact member 185.

The bottom substrate 110 includes a display area DA and a peripheral area PA surrounding the display area DA. The bottom substrate 110 may be formed of any of various suitable materials including glass materials, metals, and plastic materials. A plurality of thin-film transistors TFT1 are located in the display area DA of the bottom substrate 110, where the organic light emitting devices 200 electrically connected to the plurality of thin-film transistors TFT1 may also be located. In other words, the plurality of organic light emitting devices 200 are located in the display area DA of the bottom substrate 110. Electric connection between the organic light emitting devices 200 and the plurality of thin-film transistors TFT1 may be understood as electric connection between a plurality of pixel electrodes 210 and the plurality of thin-film transistors TFT1. Here, a thin-film transistor TFT2 may be located in the peripheral area PA of the bottom substrate 110. The thin-film transistor TFT2 may be a portion of a circuit unit for controlling electric signals applied into the display area DA, for example.

The thin-film transistor TFT1 or the thin-film transistor TFT2 includes a semiconductor layer 130 which contains amorphous silicon, polycrystalline silicon, or an organic semiconductor material; a gate electrode 150; and source/drain electrodes 170. On the bottom substrate 110, a buffer layer 120 that is formed of silicon oxide or silicon nitride may be located on the bottom substrate 110 to planarize the top surface of the bottom substrate 110 or to prevent permeation of impurities into the semiconductor layer 130, and the semiconductor layer 130 may be located on the buffer layer 120.

The gate electrode 150 is located on the semiconductor layer 130. The source/drain electrodes 170 electrically communicate with the semiconductor layer 130 according to signals applied to the gate electrode 150. The gate electrode 150 may be formed as a single layer or a multi-layer containing at least one of aluminium (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybedenum (Mo), titanium (Ti), tungsten (W), and copper (Cu), selected in consideration of adherence to an adjacent layer, surface planarity of a layer to be stacked thereon, and processability. Here, to secure the insulation between the semiconductor layer 130 and the gate electrode 150, a gate insulation layer 140 formed of silicon oxide and/or silicon nitride may be interposed between the semiconductor layer 130 and the gate electrode 150.

An interlayer insulation layer 160 may be located on the gate electrode 150, where the interlayer insulation layer 160 may be formed as a single layer or a multi-layer containing silicon oxide or silicon nitride.

The source/drain electrodes 170 are located on the interlayer insulation layer 160. The source/drain electrodes 170 are electrically connected to the semiconductor layer 130 via contact holes formed in the interlayer insulation layer 160 and the gate insulation layer 140. The source/drain electrodes 170 may be formed as a single layer or a multi-layer containing at least one of aluminium (Al), platinum (Pt), palladium (Pd), silver (Ag), magnesium (Mg), gold (Au), nickel (Ni), neodymium (Nd), iridium (Ir), chrome (Cr), lithium (Li), calcium (Ca), molybedenum (Mo), titanium (Ti), tungsten (W), and copper (Cu), selected in consideration of conductivity.

To protect the thin-film transistor TFT1 and/or the thin-film transistor TFT2 having the structure as described above, a first insulation layer 181, which is a protection layer covering the thin-film transistor TFT1 and/or the thin-film transistor TFT2, may be arranged. The first insulation layer 181 may be formed of an inorganic material, such as a silicon oxide, a silicon nitride, or a silicon oxynitride. Although FIG. 1 shows that the first insulation layer 181 has a single layer structure, various suitable modifications may be made therein, e.g., the first insulation layer 181 may have a multi-layer structure.

If necessary, a second insulation layer 182 may be located on the first insulation layer 181. For example, as shown in FIG. 1, if the organic light emitting devices 200 are located on the thin-film transistors TFT1, the second insulation layer 182 may be arranged as a planarizing layer for substantially planarizing the top surface of the first insulation layer 181 covering the thin-film transistors TFT1. The second insulation layer 182 may be formed of an acrylic-based organic material or benzocyclobutene (BCB). Although FIG. 1 shows that the second insulation layer 182 has a single layer structure, various modifications may be made therein, e.g., the second insulation layer 182 may have a multi-layer structure.

In the display area DA of the bottom substrate 110, the organic light emitting device 200 including the pixel electrode 210, a counter electrode 230, and an intermediate layer 220, which is located between the pixel electrode 210 and the counter electrode 230 and includes an emission layer, is located on the second insulation layer 182.

Openings that exposes at least one of the source/drain electrodes 170 of the thin-film transistor TFT1 are formed in the first insulation layer 181 and the second insulation layer 182, and the pixel electrode 210, which contacts one of the source/drain electrodes 170 and is electrically connected to the thin-film transistor TFT1, is located on the second insulation layer 182. The pixel electrode 210 may be formed as a (semi-) transparent electrode or a reflective electrode. When the pixel electrode 210 is formed as a (semi-) transparent electrode, the pixel electrode 210 may be formed of ITO, IZO, ZnO, $In_2O_3$, IGO, or AZO, for example. When the pixel electrode 210 is formed as a reflective electrode, the pixel electrode 210 may include a reflective layer formed of Ag, Mg, Al, Pt, Pd, Au, Ni, Nd, Ir, Cr, or a compound thereof and a layer formed of ITO, IZO, ZnO, $In_2O_3$, IGO, or AZO. However, the present invention is not limited thereto, and various modifications may be made therein. For example, the pixel electrode 210 may be formed of any of various other suitable materials and may have a single layer structure or a multi-layer structure.

A third insulation layer 183 may be located on the second insulation layer 182. The third insulation layer 183 is a pixel defining layer and defines pixels by having openings corresponding to the respective sub-pixels, that is, openings exposing at least the center portions of the pixel electrodes 210. Furthermore, in a case as shown in FIG. 1, the third insulation layer 183 prevents the formation of arc at an end portion of the pixel electrode 210 by increasing the distance between the end portion of the pixel electrode 210 and the counter electrode 230 above the pixel electrode 210. The third insulation layer 183 may be formed of an organic material, e.g., polyimide.

The intermediate layer 220 of the organic light emitting devices 200 may contain a small molecule material or a polymer material. If the intermediate layer 220 contains a small molecule material, the intermediate layer 220 may be formed to include a hole injection layer (HIL), a hole transport layer (HTL), an emission layer (EML), an electron transport layer (ETL), and an electron injection layer (EIL) in a stacked structure, where the small molecule material may include any of various suitable materials including copper phthalocyanine (CuPc), N,N'-Di(naphthalene-1-yl)-N,N'-diphenyl-benzidine (NPB), and tris-8-hydroxyquinoline aluminium (Alq3). The layers may be formed via vacuum deposition, for example.

If the intermediate layer 220 contains a polymer material, the intermediate layer 220 may generally have a structure including a HTL and an EML. Here, the HTL may be formed of PEDOT, the EML may be formed of a polymer material, such as a poly-phenylenevinylene (PPV) based material or a polyfluorene-based material, via screen printing, inkjet printing, or laser induced thermal imaging (LITI).

However, the present invention is not limited thereto, and the intermediate layer 220 may have any of various other suitable structures.

The counter electrode 230 is located above the display area DA, where the counter electrode 230 may be arranged to cover the display area DA as shown in FIG. 1. In other words, the counter electrode 230 may be integrated with the plurality of organic light emitting devices 200 and may correspond to the plurality of pixel electrodes 210 (e.g., as a continuous layer), respectively. The counter electrode 230 may be formed as a (semi-) transparent electrode or a reflective electrode. If the counter electrode 230 is formed as a (semi-) transparent electrode, the counter electrode 230 may include a layer formed of a metal having a small work function, e.g., Li, Ca, LiF/Ca, LiF/Al, Al, Ag, Mg, or a compound thereof, and a (semi-) transparent layer formed of ITO, IZO, ZnO, or $In_2O_3$. If the counter electrode 230 is formed as a reflective electrode, the counter electrode 230 may include a layer formed of Li, Ca, LiF/Ca, LiF/Al, Al, Ag, Mg, or a compound thereof. However, the present invention is not limited thereto, and various modifications may be made therein.

The top substrate 300 corresponds to the bottom substrate 110 and may be formed of any of various suitable materials including glass materials, metals, and plastic materials. The bottom substrate 110 and the top substrate 300 may be attached to each other via the sealing member 400. The sealing member 400 may include frit or epoxy. However, the present invention is not limited thereto. The sealing member 400 is located in the peripheral area PA of the bottom substrate 110.

Like the sealing member 400, the anti-impact member 185 is located in the peripheral area PA of the bottom substrate 110 and protrudes from the bottom substrate 110 toward the top substrate 300. However, the anti-impact member 185 is located apart from the sealing member 400.

FIGS. 2 and 3 are schematic diagrams showing that the top substrate 300 is moved by external impact when the anti-impact member 185 does not exist. As shown in FIGS. 2 and 3, if the anti-impact member 185 does not exist, when an external impact is applied, the top substrate 300 of an organic light emitting display apparatus is oscillated as indicated by the reference numerals 300a and 300b in FIGS. 2 and 3. Since the oscillation is large, problems including formation of cracks at the top substrate 300 may occur. Particularly, since the third insulation layer 183, which is a pixel defining layer, is located in the display area DA, no problem may occur in the display area DA. However, oscillation of the top substrate 300 due to an external impact may be large enough to form cracks in the peripheral area PA.

For example, when an organic light emitting display apparatus is arranged at a portable mobile device and the portable mobile device is dropped to the ground, impact is applied to a corner or an edge of the organic light emitting display apparatus. Such an impact may induce large oscillation of the top substrate 300 in the peripheral area PA, cracks may form at the top substrate 300, and the cracks of the top substrate 300 may extend to the display area DA.

Figure 4:
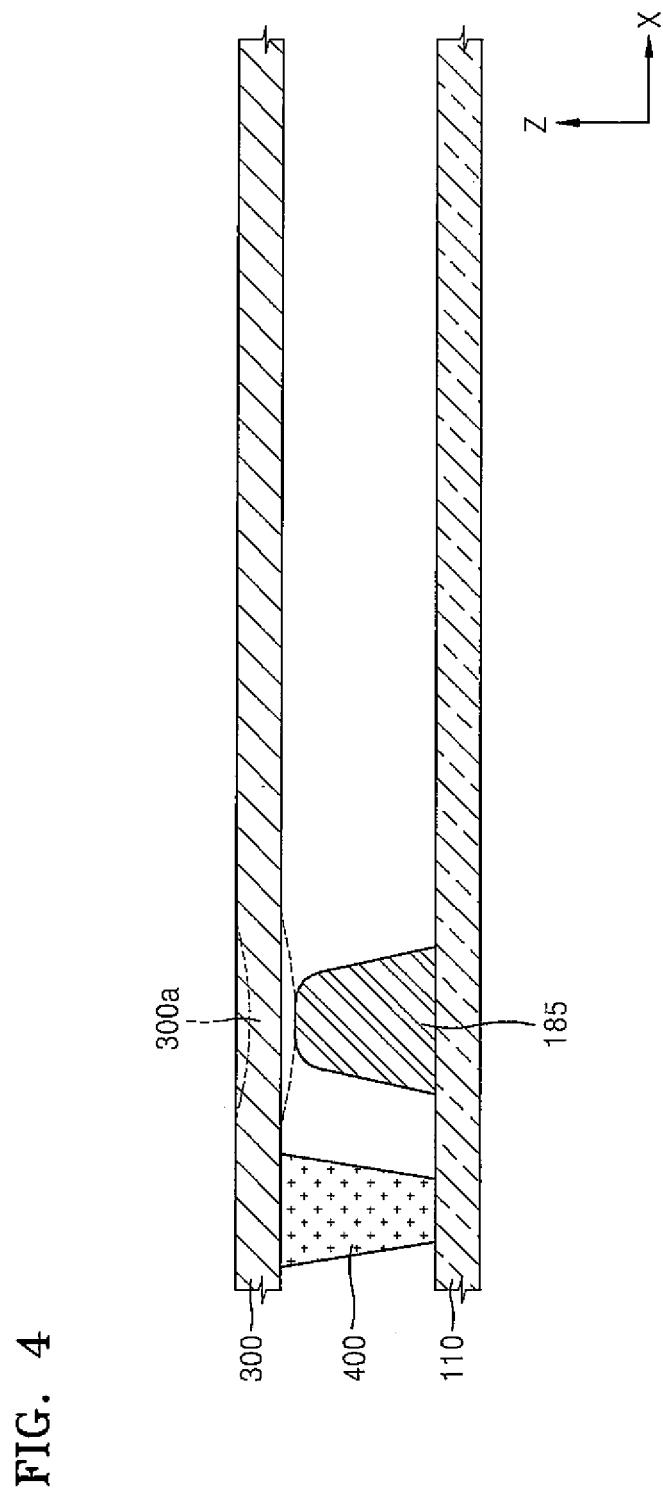
FIG. 4 is a schematic diagram showing that the top electrode is moved by an external impact in the organic light emitting display apparatus of FIG. 1.

However, as shown in FIG. 4, which is a schematic diagram showing movement of the top substrate 300 due to an external impact in the organic light emitting display apparatus of FIG. 1, the anti-impact member 185 is located in the peripheral area PA in the organic light emitting display apparatus according to the present embodiment, and thus oscillation of the top substrate 300 due to an external impact may be effectively reduced. As a result, possible damages to the top substrate 300 due to external impacts may be significantly reduced. In other words, when the top substrate 300 oscillates in a direction toward the bottom substrate 110 due to an external impact, the top substrate 300 contacts the anti-impact member 185, and thus oscillation of the top substrate 300 may be effectively reduced. As a result, oscillation of the top substrate 300 due to an external impact may be reduced, thereby significantly reducing possible damages to the top substrate 300.

Also, an end portion of the anti-impact member 185 toward the top substrate 300 may contact the top substrate 300 or may not contact the top substrate 300 as shown in FIG. 1. In other words, a space 185d may be formed between the end portion of the anti-impact member 185 toward the top substrate 300 and the top substrate 300.

As described above, the third insulation layer 183, which is a pixel defining layer, exists in the display area DA, and the anti-impact member 185 may have a shape similar to that of the third insulation layer 183. In more detail, the anti-impact member 185 may be formed concurrently (e.g., simultaneously) when the third insulation layer 183 is formed. In this case, the anti-impact member 185 may contain the same material as the third insulation layer 183.

At this point, a distance d1 between the bottom substrate 110 and the end portion (i.e., the end surface) 185es of the anti-impact member 185 toward the top substrate 300 may be identical to a distance d2 between the bottom substrate 110 and an end portion 183es of the third insulation layer 183, which is a pixel defining layer, toward the top substrate 300. In this case, the counter electrode 230 on the third insulation layer 183, which is a pixel defining layer, contacts the top substrate 300, the space 185d corresponding to the thickness of the counter electrode 230 is formed between the top substrate 300 and the end portion of the anti-impact member 185 toward the top substrate 300. Here, since the thickness of the counter electrode 230 is about 1000 Å (which is very small), the end portion of the anti-impact member 185 toward the top substrate 300 may be seen or regarded as (almost) contacting the top substrate 300.

Also, as shown in FIG. 1, an electrode power supply line 190 and a connecting unit 192 may be interposed between the anti-impact member 185 and the bottom substrate 110. The electrode power supply line 190 may be located on the same layer as any one of the electrodes included in the plurality of thin-film transistors TFT1 and TFT2. For example, the electrode power supply line 190 may be located on the same layer as the source/drain electrodes 170 included in the plurality of thin-film transistors TFT1 and TFT2. In this case, the electrode power supply line 190 may be formed concurrently (e.g., simultaneously) as the source/drain electrodes 170 are formed, where the electrode power supply line 190 and the source/drain electrodes 170 may be formed of the same material. A first end portion 192a of the connecting unit 192 may be located on the same layer as the plurality of pixel electrodes 210 and may contact the counter electrode 230, whereas a second end portion 192b may contact the electrode power supply line 190. The connecting unit 192 may be formed concurrently (e.g., simultaneously) as the plurality of pixel electrodes 210, where the connecting unit 192 and the plurality of pixel electrodes 210 are formed of the same material.

As described above, the anti-impact member 185 is located in the peripheral area PA of the bottom substrate 110. The peripheral area PA is a dead space in which image is not displayed. The smaller the dead space is, the larger the display area DA becomes, and thus a high-quality organic light emitting display apparatus having larger display area DA may be embodied.

If the anti-impact member 185 is located between the electrode power supply line 190 and the sealing member 400, the peripheral area PA becomes larger inevitably. However, in the organic light emitting display apparatus according to the present embodiment, the anti-impact member 185 is located on the electrode power supply line 190 and/or the connecting unit 192. In other words, the electrode power supply line 190 and the connecting unit 192 are interposed between the anti-impact member 185 and the bottom substrate 110. As a result, a high-quality organic light emitting display apparatus, in which the top substrate 300 is less likely damaged by external impacts and the dead space is small, may be embodied.

Although FIG. 1 shows that the anti-impact member 185 contacts the electrode power supply line 190 and the connecting unit 192, the anti-impact member 185 may only contact either the electrode power supply line 190 or the connecting unit 192. Furthermore, a portion of the anti-impact member 185 may contact a layer located below the electrode power supply line 190 (e.g., the interlayer insulation layer 160). In other words, the anti-impact member 185 may contact one of the electrode power supply line 190, the connecting unit 192, and a layer located below the electrode power supply line 190.

Also, a distance d between an end portion toward the display area DA of a portion of the sealing member 400 contacting the top substrate 300 and the center of the anti-impact member 185 may be within 150 µm. As described above with reference to FIGS. 2 through 4, if the top substrate 300 oscillates outside the display area DA due to an external impact, possible damages to the top substrate 300 is reduced by reducing oscillation of the top substrate 300. If a distance between the sealing member 400 and the anti-impact member 185 is too far, oscillation of the top substrate 300 in an area between the sealing member 400 and the anti-impact member 185 may be large enough to damage the top substrate 300. Therefore, it is necessary to limit the distance between the sealing member 400 and the anti-impact member 185. Particularly, since it is necessary to reduce the oscillation of the top substrate 300, it is necessary to limit the distance d between an end portion toward the display area DA of the portion of the sealing member 400 contacting the top substrate 300 and the center of the anti-impact member 185.

After repeated experiments, if the distance d exceeds 150 µm, the possibility of damaging the top substrate 300 in an area between the sealing member 400 and the anti-impact member 185 rapidly increased, in consideration of the general thickness of the top substrate 300 used in an organic light emitting display apparatus. Therefore, in one embodiment, the distance d between an end portion toward the display area DA of the portion of the sealing member 400 contacting the top substrate 300 and the center of the anti-impact member 185 is within 150 µm (i.e., 150 µm or less).

Figure 5:
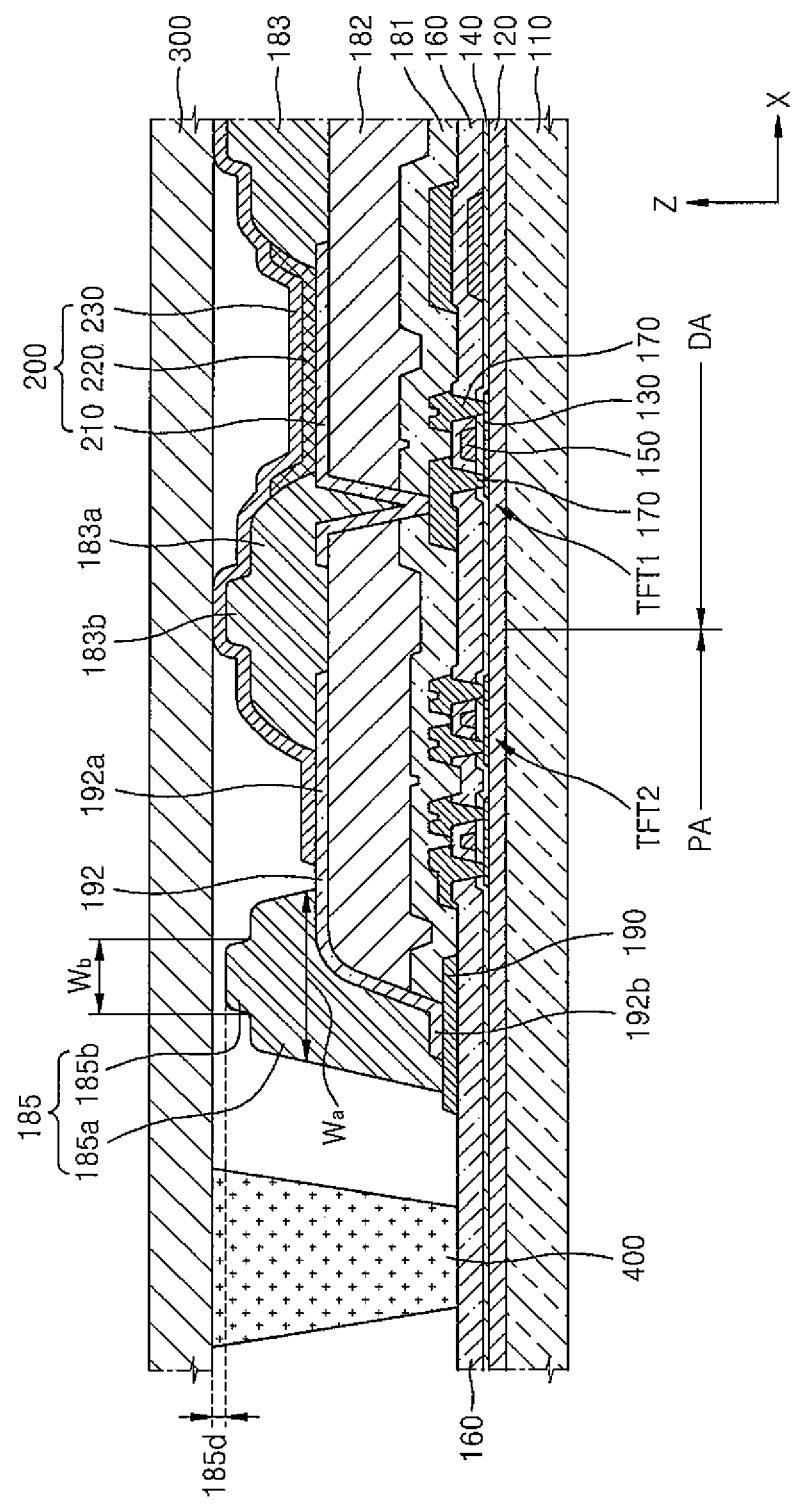
FIG. 5 is a schematic sectional view of an organic light emitting display apparatus according to another embodiment of the present invention.

FIG. 5 is a schematic sectional view of an organic light emitting display apparatus according to another embodiment of the present invention. The organic light emitting display apparatus according to the present embodiment is identical to the organic light emitting display apparatus according to the previous embodiment described above with reference to FIG. 1 except for the shape of the anti-impact member 185.

The anti-impact member 185 of the organic light emitting display apparatus according to the present embodiment includes a first portion 185a having a first width Wa and a second portion 185b having a second width Wb, which is smaller than the first width Wa. Here, the anti-impact member 185 has a structure in which the first portion 185a is closer to the bottom substrate 110 than the second portion 185b. Here, as shown in FIG. 5, the third insulation layer 183, which is a pixel defining layer, may have a similar shape as the anti-impact member 185.

As described above, the anti-impact member 185 may be concurrently (e.g., simultaneously) formed as the third insulation layer 183, which is a pixel defining layer, is formed, where the anti-impact member 185 and the third insulation layer 183, which is a pixel defining layer, may be formed of the same material. If necessary, the third insulation layer 183, which is a pixel defining layer, may have a shape in which the width of a portion toward the top substrate 300 is smaller than the width of a portion toward the bottom substrate 110, so that a side surface of the third insulation layer has a bent or curved surface. Here, as the anti-impact member 185 is formed to have a similar structure as the third insulation layer 183, which is a pixel defining layer, ease of fabrication thereof may be significantly improved.

Here, if at least a portion of the intermediate layer 220 is formed via LITI and a material from a donor film is attached to the top surface of the third insulation layer 183, which is a pixel defining layer, the third insulation layer 183, which is a pixel defining layer, may have a shape in which the width of a portion toward the top substrate 300 is smaller than the width of a portion toward the bottom substrate 110 so that a side surface of the third insulation layer has a bent or curved surface as shown in FIG. 5 to minimize or reduce the attachment of the material from the donor film.

Also, the second width Wb of the second portion 185b of the anti-impact member 185, that is, the second width Wb at an end portion of the second portion 185b toward the first portion 185a may be from about 20 µm to about 100 µm. If the second width Wb is smaller than 20 µm, the second width Wb of the second portion 185b becomes too small to provide or maintain sufficient durability, and thus the second portion 185b may become fragile. Furthermore, if the anti-impact member 185 is located above the electrode power supply line 190 to reduce the dead space, it is difficult to make the second width Wb greater than 100 µm.

Figure 6:
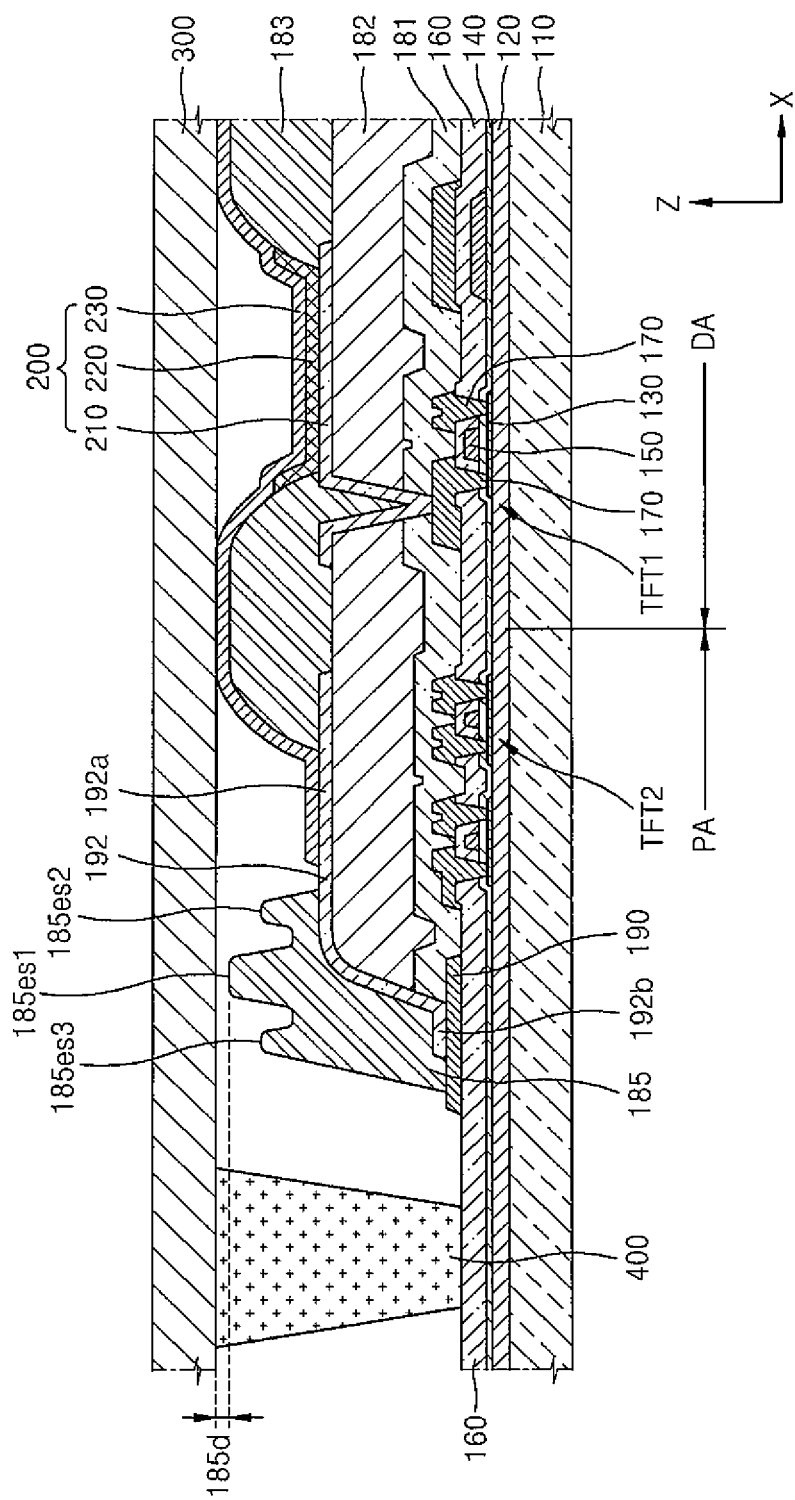
FIG. 6 is a schematic sectional view of an organic light emitting display apparatus according to another embodiment of the present invention.

FIG. 6 is a sectional view of an organic light emitting display apparatus according to another embodiment of the present invention. The organic light emitting display apparatus according to the present embodiment is identical to the organic light emitting display apparatus according to the previous embodiment described above with reference to FIG. 1 except that the anti-impact member 185 has a "屵"-like cross-sectional shape on a plane (zx plane) perpendicular to the bottom substrate 110.

In other words, the anti-impact member 185 includes a first end surface 185es1, a second end surface 185es2, and a third end surface 185es3 that face toward the top substrate 300 and are apart from one another. Here, a first distance between the bottom substrate 110 and the first end surface 185es1 is longer than each of a second distance between the bottom substrate 110 and the second end surface 185es2 and a third distance between the bottom substrate 110 and the third end surface 185es3, Furthermore, the second end surface 185es2 is located closer to the display area DA than the first end surface 185es1 is, and the third end surface 185es3 is located closer to the sealing member 400 than the first end surface 185es1 is.

When an external impact is applied to the top substrate 300, the anti-impact member 185 having a shape as described above may effectively absorb impact transmitted to the anti-impact member 185 via the top substrate 300. In other words, an impact transmitted to the anti-impact member 185 via the first end surface 185es1 is transmitted to the second end surface 185es2 or the third end surface 185es3, and, since portions nearby the second end surface 185es2 and the third end surface 185es3 are free ends, the corresponding end portions may oscillate without transmitting the impact to other components and effectively absorb the impact. Here, although not shown in FIG. 6, a portion of the third insulation layer 183, which is a pixel defining layer, toward the top substrate 300 may have the same shape or a similar shape as that of the portion of the anti-impact member 185 toward the top substrate 300.

Figure 7:
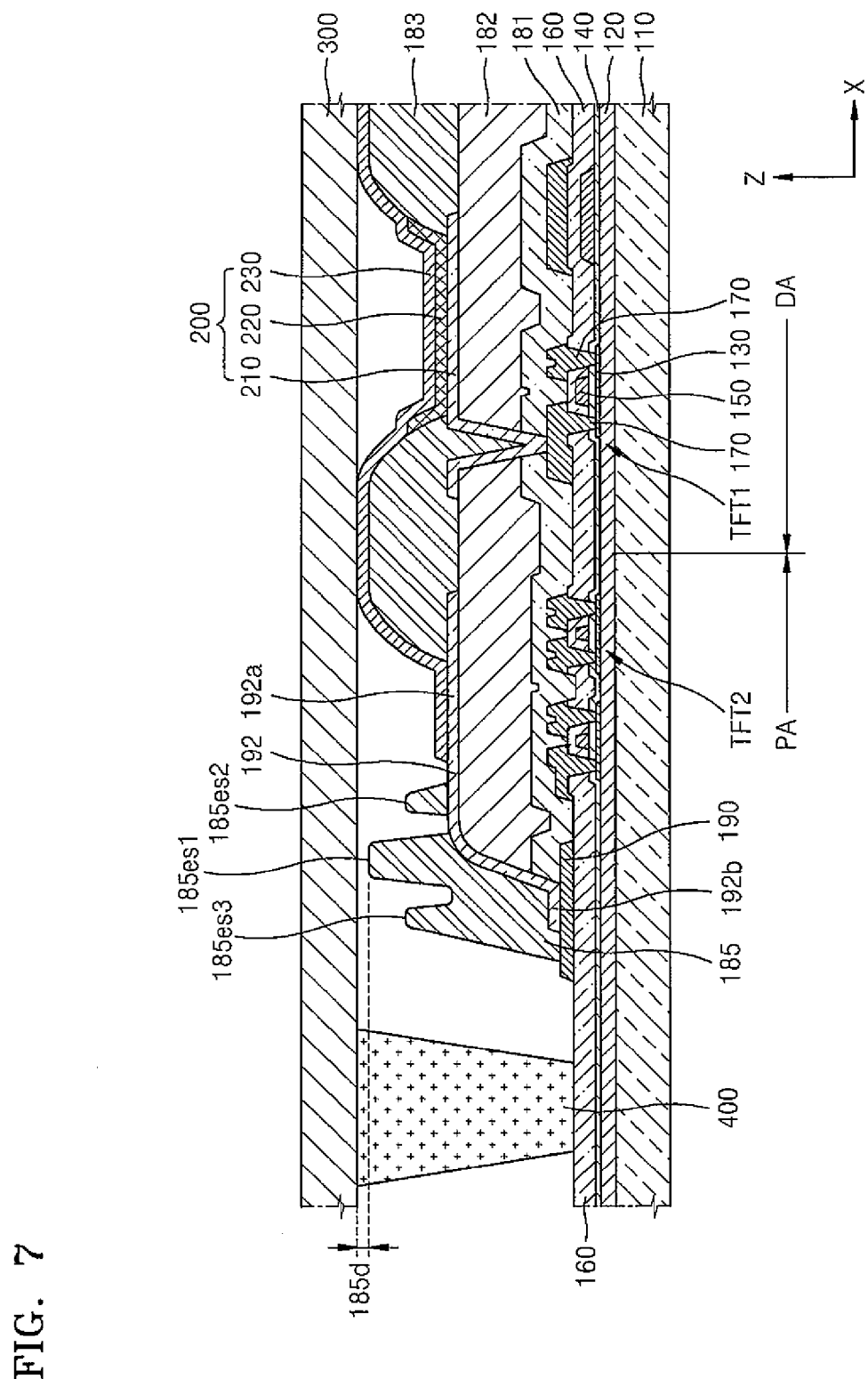
FIG. 7 is a schematic sectional view of an organic light emitting display apparatus according to another embodiment of the present invention.

As shown in FIG. 7, which is a schematic sectional view of an organic light emitting display apparatus according to another embodiment of the present invention, a portion of the anti-impact member 185 nearby and under the second end surface 185es2 may be apart from a portion nearby and under the first end surface 185es1 or a portion nearby and under the third end surface 185es3 and may also be located on the connecting unit 192.

Figure 8:
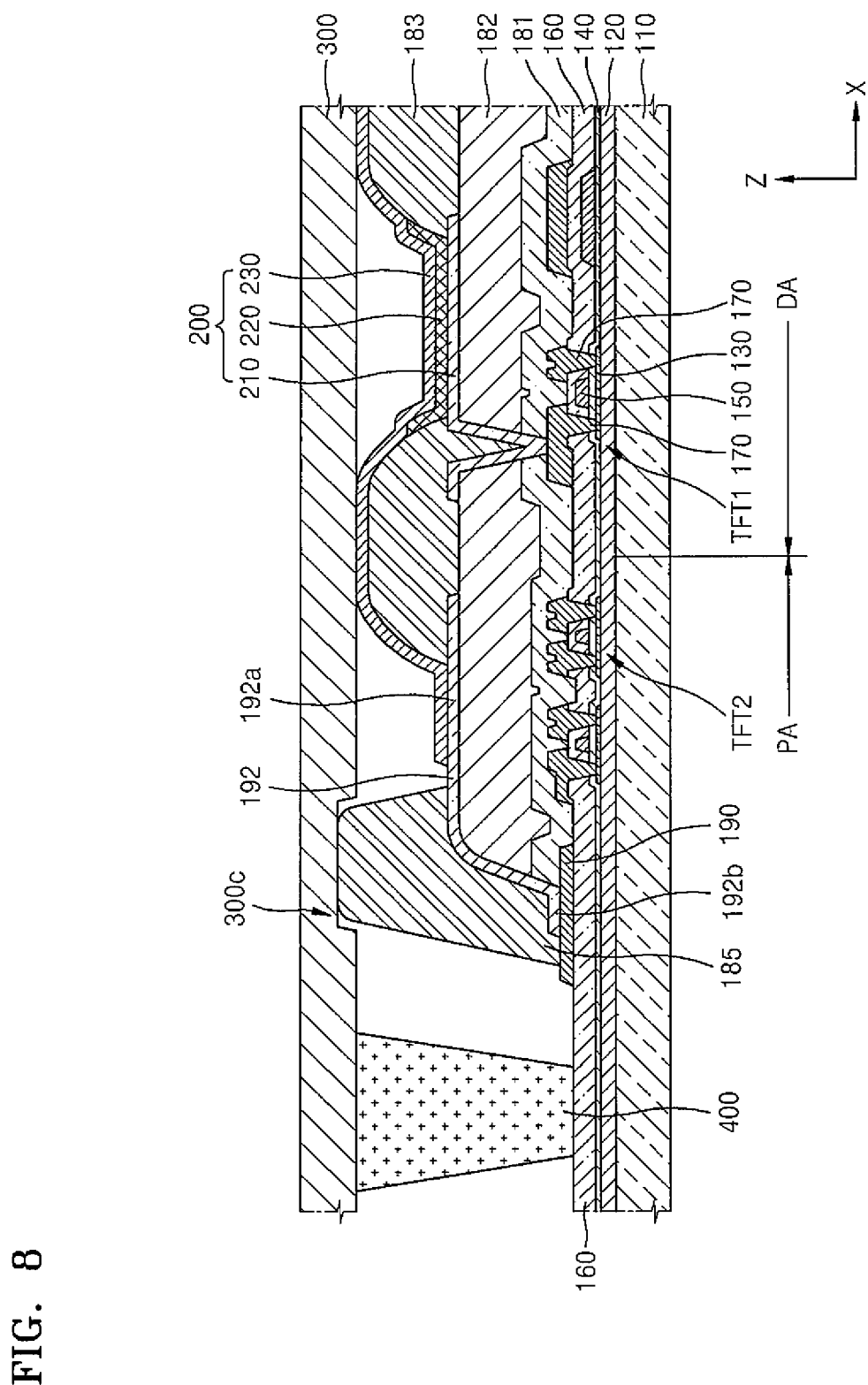
FIG. 8 is a schematic sectional view of an organic light emitting display apparatus according to another embodiment of the present invention.

FIG. 8 is a schematic sectional view of an organic light emitting display apparatus according to another embodiment of the present invention. The organic light emitting display apparatus according to the present embodiment is identical to the organic light emitting display apparatus according to the previous embodiment described above with reference to FIG. 1 except that the top substrate 300 has a trench 300c at a position on a surface of the top substrate 300 facing the bottom substrate 110, the position corresponding to the anti-impact member 185, and a portion of the anti-impact member 185 toward the top substrate 300 is located inside the trench 300c of the top substrate 300. In this case, the anti-impact member 185 may contact the top substrate 300.

When an external impact is applied to the top substrate 300, the structure as described above may effectively prevent the top substrate 300 from oscillating via the anti-impact member 185. Particularly, since the anti-impact member 185 is located inside the trench 300c of the top substrate 300, the anti-impact member 185 may not only prevent oscillation of the top substrate 300, but also directly absorb an external impact applied to the top substrate 300.

Here, a distance between the bottom substrate 110 and an end surface of the third insulation layer 183 toward the top substrate 300 is different from a distance between the bottom substrate 110 and an end surface of the anti-impact member 185 toward the top substrate 300. However, if the anti-impact member 185 and the third insulation layer 183, which is a pixel defining layer, are formed by using a two-tone mask, the anti-impact member 185 and the third insulation layer 183, which is a pixel defining layer, may be concurrently (e.g., simultaneously) formed of the same material. Here, regardless of the formation of the third insulation layer 183, the anti-impact member 185 may be formed in a different operation.

Figure 9:
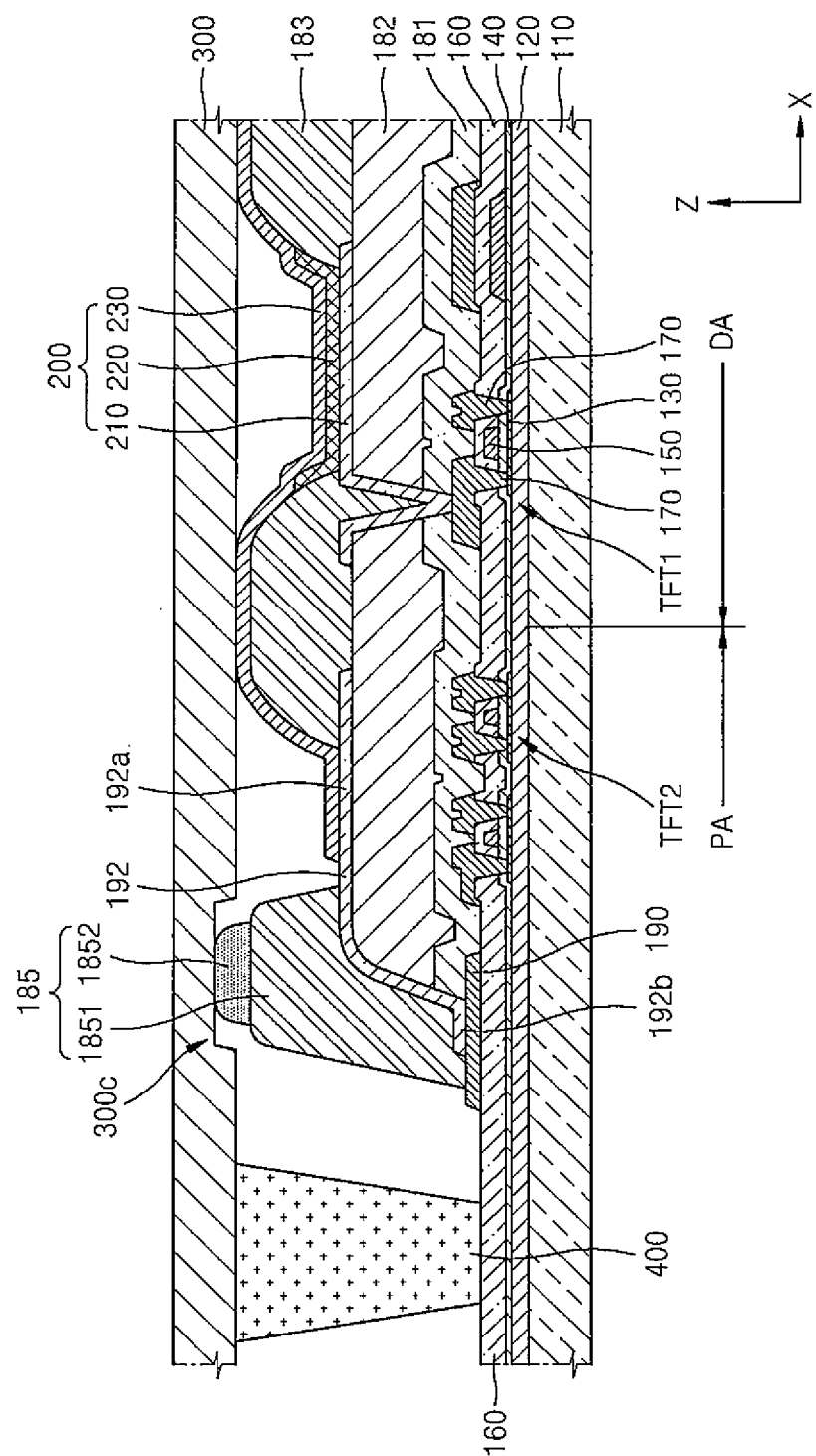
FIG. 9 is a schematic sectional view of an organic light emitting display apparatus according to another embodiment of the present invention.

Furthermore, as shown in FIG. 9, which is a schematic sectional view of an organic light emitting display apparatus according to another embodiment of the present invention, when the third insulation layer 183, which is a pixel defining layer, is formed, a first anti-impact unit 1851 may be concurrently (e.g., simultaneously) formed of the same material, and then a second anti-impact unit 1852 may be further formed on the first anti-impact unit 1851, such that the anti-impact member 185 includes the first anti-impact unit 1851 and the second anti-impact unit 1852 and a portion of the second anti-impact unit 1852 is located inside the trench of the top substrate 300c of the top substrate 300. In this case, a distance between the bottom substrate 110 and an end surface of the first anti-impact unit 1851 toward the top substrate 300 may be identical to a distance between the bottom substrate 110 and an end surface of the third insulation layer 183, which is a pixel defining layer, toward the top substrate 300. The second anti-impact unit 1852 may be formed of the same material or a different organic/inorganic material as the first anti-impact unit 1851.

Figure 10:
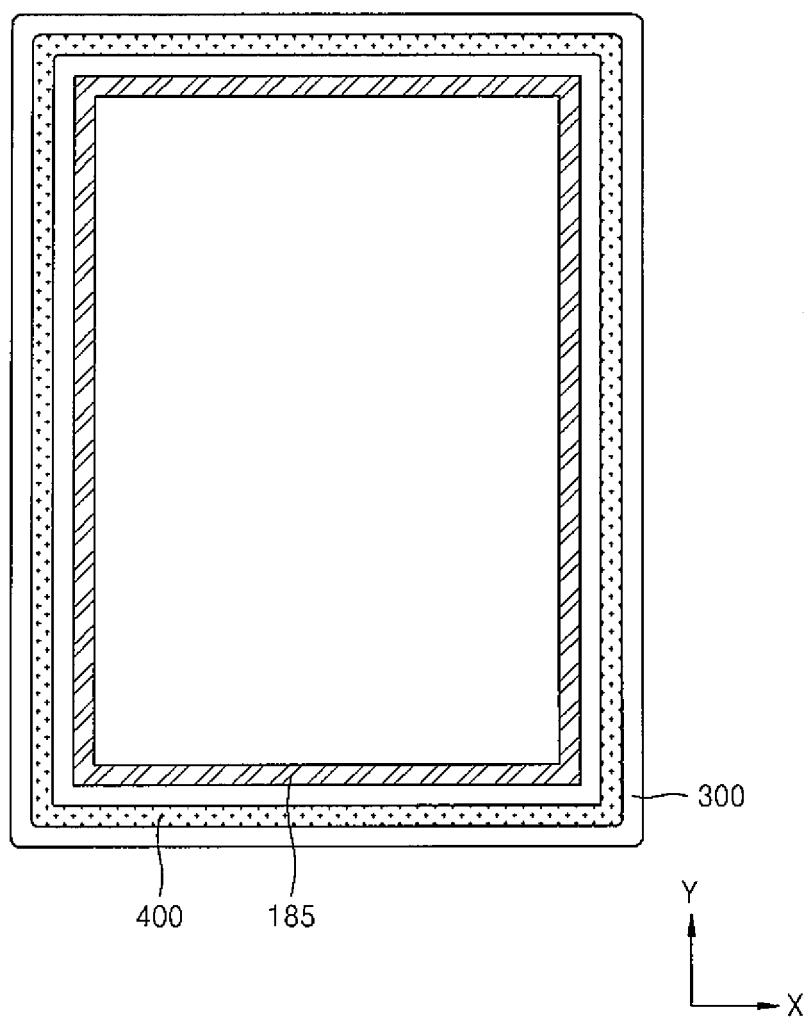
FIG. 10 is a schematic sectional plan view of an organic light emitting display apparatus according to another embodiment of the present invention.
Figure 11:
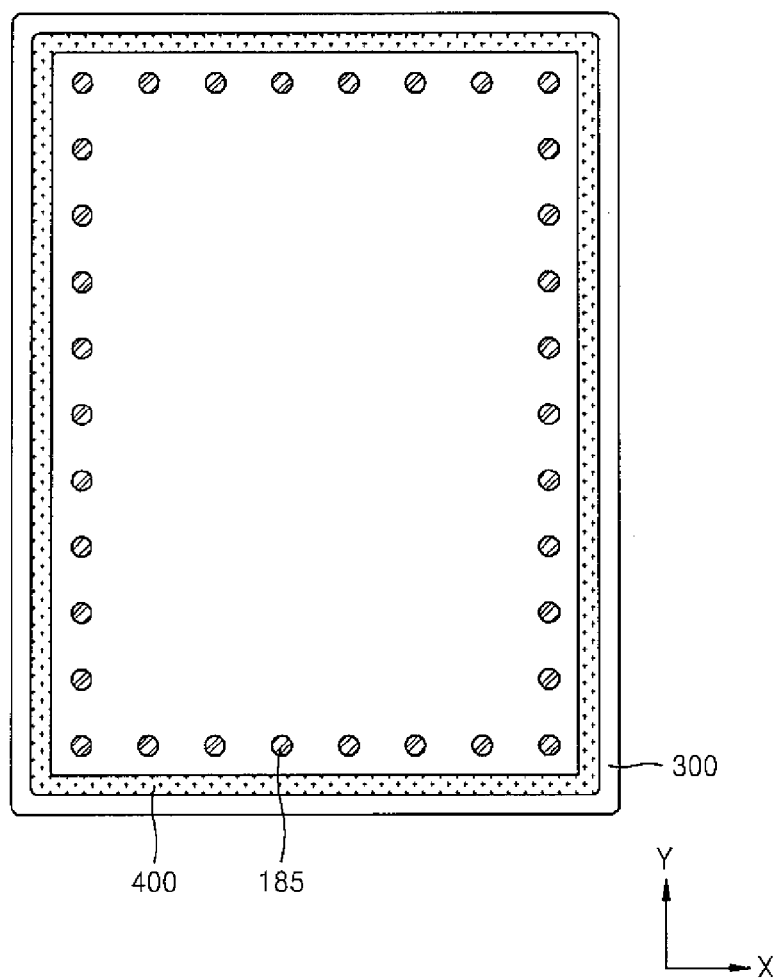
FIG. 11 is a schematic sectional plan view of an organic light emitting display apparatus according to another embodiment of the present invention.

FIG. 10 is a schematic sectional plan view of an organic light emitting display apparatus according to another embodiment of the present invention. As shown in FIG. 10, the anti-impact member 185 may surround the display area DA of the bottom substrate 110. Furthermore, as shown in FIG. 11, which is a schematic sectional plan view of an organic light emitting display apparatus according to another embodiment of the present invention, the anti-impact member 185 may be discretely located around the display area DA of the bottom substrate 110. In this case, a material for forming the anti-impact member 185 may be saved.

The embodiments described above may be mixed (or combined) with one another. For example, as shown in FIG. 8 or FIG. 9, a portion of an end portion of the anti-impact member 185 toward the top substrate 300 is located inside the trench 300c of the top substrate 300, the end portion of the anti-impact member 185 toward the top substrate 300 may have a simple protruding shape as shown in FIG. 1, a bent-protruding shape as shown in FIG. 5, or an "凵"-like shape as shown in FIG. 6 or FIG. 7.

According to the above embodiments of the present invention, an organic light emitting display apparatus with improved impact resistance may be embodied. However, the present invention is not limited thereto.

While the present invention has been particularly shown and described with reference to example embodiments thereof, it will be understood by those of ordinary skill in the art that various changes in form and details may be made therein without departing from the spirit and scope of the present invention as defined by the following claims, and equivalents thereof.

What is claimed is:

1. An organic light emitting display apparatus comprising:
   a bottom substrate having a display area and a peripheral area, the peripheral area being outside the display area and surrounding the display area;
   a plurality of organic light emitting devices in the display area of the bottom substrate, the plurality of organic light emitting devices having a plurality of pixel electrodes, a counter electrode corresponding to the plurality of pixel electrodes, and an intermediate layer between the plurality of pixel electrodes and the counter electrode, the intermediate layer comprising an emission layer;
   a pixel defining layer in the display area of the bottom substrate and configured to cover edge portions of the plurality of pixel electrodes and to expose center portions of the plurality of pixel electrodes;
   a top substrate corresponding to the bottom substrate;
   a sealing member in the peripheral area of the bottom substrate and configured to attach the bottom substrate to the top substrate; and
   an anti-impact member in the peripheral area of the bottom substrate and apart from at least one of the sealing member, the counter electrode, and the pixel defining layer, the anti-impact member protruding from the bottom substrate toward the top substrate,
   wherein a space is formed between the top substrate and a top end surface of the anti-impact member facing toward the top substrate, and
   the space between the top substrate and the top end surface of the anti-impact member facing toward the top substrate corresponds to a thickness of the counter electrode.

2. The organic light emitting display apparatus of claim 1, wherein:
   the top substrate has a trench at a position corresponding to the anti-impact member on a surface facing the bottom substrate, and
   a portion of the anti-impact member toward the top substrate is located inside the trench.

3. The organic light emitting display apparatus of claim 1, wherein the anti-impact member surrounds the display area of the bottom substrate.

4. The organic light emitting display apparatus of claim 1, wherein the anti-impact member is discretely located around the display area of the bottom substrate.

5. The organic light emitting display apparatus of claim 1, wherein the anti-impact member has an "凵"-like cross-sectional shape on a plane perpendicular to the bottom substrate.

6. The organic light emitting display apparatus of claim 1, wherein:

the anti-impact member comprises a first end surface, a second end surface, and a third end surface, the first, second, and third end surfaces facing toward the top substrate and being apart from one another, and a first distance between the bottom substrate and the first end surface is longer than each of a second distance between the bottom substrate and the second end surface and a third distance between the bottom substrate and the third end surface.

7. The organic light emitting display apparatus of claim 6, wherein:

the second end surface is closer to the display area of the bottom substrate than the first end surface is, and the third end surface is closer to the sealing member than the first end surface is.

8. The organic light emitting display apparatus of claim 1, wherein the anti-impact member does not overlap the counter electrode when viewed from the bottom substrate.

9. An organic light emitting display apparatus comprising:

a bottom substrate having a display area and a peripheral area surrounding the display area;

a plurality of organic light emitting devices in the display area of the bottom substrate, the plurality of organic light emitting devices having a plurality of pixel electrodes;

a pixel defining layer in the display area of the bottom substrate and configured to cover edge portions of the plurality of pixel electrodes and to expose center portions of the plurality of pixel electrodes;

a top substrate corresponding to the bottom substrate;

a sealing member in the peripheral area of the bottom substrate and configured to attach the bottom substrate to the top substrate; and an anti-impact member in the peripheral area of the bottom substrate and apart from the sealing member, the anti-impact member protruding from the bottom substrate toward the top substrate, wherein:

a distance between the bottom substrate and a top end surface of the anti-impact member facing toward the top substrate is identical to a distance between the bottom substrate and a top end surface of the pixel defining layer facing toward the top substrate.

10. The organic light emitting display apparatus of claim 9, wherein the anti-impact member comprises a same material as the pixel defining layer.

11. An organic light emitting display apparatus comprising:

a bottom substrate having a display area and a peripheral area surrounding the display area;

a plurality of organic light emitting devices in the display area of the bottom substrate;

a top substrate corresponding to the bottom substrate;

a sealing member in the peripheral area of the bottom substrate and configured to attach the bottom substrate to the top substrate; and an anti-impact member in the peripheral area of the bottom substrate and apart from the sealing member, the anti-impact member protruding from the bottom substrate toward the top substrate, wherein:

the plurality of organic light emitting devices comprise a plurality of pixel electrodes, a counter electrode corresponding to the pixel electrodes, and an intermediate layer between the plurality of pixel electrodes and the counter electrode and comprises an emission layer, the organic light emitting display apparatus further comprises:

a plurality of thin-film transistors in the display area of the bottom substrate and are electrically connected to the plurality of pixel electrodes, and an electrode power supply line on a same layer as one electrode of the plurality of thin-film transistors, and a connecting unit between the anti-impact member and the bottom substrate, the connecting unit having a first end on a same layer as the plurality of pixel electrodes and contacting the counter electrode and a second end contacting the electrode power supply line.

12. The organic light emitting display apparatus of claim 11, wherein the electrode power supply line is on a same layer as source/drain electrodes of the electrodes of the plurality of thin-film transistors.

13. The organic light emitting display apparatus of claim 11, wherein the anti-impact member contacts the electrode power supply line or the connecting unit.

14. The organic light emitting display apparatus of claim 11, wherein the anti-impact member contacts at least one of the electrode power supply line, the connecting unit, and a layer below the electrode power supply line.

15. An organic light emitting display apparatus comprising:

a bottom substrate having a display area and a peripheral area surrounding the display area;

a plurality of organic light emitting devices in the display area of the bottom substrate, the plurality of organic light emitting devices having a plurality of pixel electrodes;

a pixel defining layer in the display area of the bottom substrate and configured to cover edge portions of the plurality of pixel electrodes and to expose center portions of the plurality of pixel electrodes;

a top substrate corresponding to the bottom substrate;

a sealing member in the peripheral area of the bottom substrate and configured to attach the bottom substrate to the top substrate; and an anti-impact member in the peripheral area of the bottom substrate and apart from the sealing member, the anti-impact member protruding from the bottom substrate toward the top substrate, wherein a distance between an end portion facing toward the display area of a portion of the sealing member contacting the top substrate and a center of the anti-impact member is within 150 μm.

* * * * *